US008853759B2

(12) United States Patent
Lee et al.

(10) Patent No.: US 8,853,759 B2
(45) Date of Patent: Oct. 7, 2014

(54) RESISTIVE MEMORY DEVICES AND METHODS OF MANUFACTURING THE SAME

(75) Inventors: Chang-bum Lee, Busan (KR); Young-soo Park, Seoul (KR); Myung-jae Lee, Suwon-si (KR); Xianyu Wenxu, Yongin-si (KR); Bo-soo Kang, Seoul (KR); Seung-eon Ahn, Seoul (KR); Ki-hwan Kim, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1093 days.

(21) Appl. No.: 12/230,223

(22) Filed: Aug. 26, 2008

(65) Prior Publication Data

US 2009/0184305 A1    Jul. 23, 2009

(30) Foreign Application Priority Data

Jan. 23, 2008 (KR) .......................... 10-2008-007082

(51) Int. Cl.
   *H01L 21/02* (2006.01)
   *H01L 27/24* (2006.01)
   *G11C 13/00* (2006.01)

(52) U.S. Cl.
   CPC ............ *H01L 27/24* (2013.01); *G11C 2213/72* (2013.01); *G11C 2213/71* (2013.01); *G11C 2213/34* (2013.01); *G11C 13/0007* (2013.01); *G11C 13/00* (2013.01)
   USPC .............................................. 257/295; 438/3

(58) Field of Classification Search
   CPC .................. H01L 45/00; H01L 27/24
   USPC .......................................................... 257/295
   See application file for complete search history.

(56) References Cited

U.S. PATENT DOCUMENTS

| 4,203,123 | A  | * | 5/1980 | Shanks ............................. 257/2 |
| 5,751,012 | A  |   | 5/1998 | Wolstenholme et al. |
| 6,507,061 | B1 | * | 1/2003 | Klersy et al. .................. 257/295 |
| 2001/0002046 | A1 | * | 5/2001 | Reinberg et al. ................. 257/3 |
| 2006/0237756 | A1 | * | 10/2006 | Park et al. ..................... 257/296 |
| 2008/0002456 | A1 | * | 1/2008 | Toda et al. .................... 365/148 |
| 2008/0049490 | A1 | * | 2/2008 | Hosaka et al. ................ 365/163 |
| 2008/0247226 | A1 | * | 10/2008 | Liu et al. ....................... 365/163 |
| 2009/0102598 | A1 | * | 4/2009 | Yamazaki et al. .............. 338/20 |

FOREIGN PATENT DOCUMENTS

| CN | 1568551      | 1/2005  |
| JP | 2002-530850 A | 9/2002  |
| JP | 2004-342843 A | 12/2004 |
| JP | 2006-51439 A  | 4/2006  |

(Continued)

OTHER PUBLICATIONS

Office Action issued on Dec. 23, 2011, in corresponding Chinese Patent Application No. 20010003249.7.

(Continued)

*Primary Examiner* — Ajay K Arora
(74) *Attorney, Agent, or Firm* — Harness, Dickey & Pierce, P.L.C.

(57) ABSTRACT

A resistive memory device includes a first electrode and a first insulation layer arranged on the first electrode. A portion of the first electrode is exposed through a first hole in the first insulation layer. A first variable resistance layer contacts the exposed portion of the first electrode and extends on the first insulation layer around the first hole. A first switching device electrically connects to the first resistive switching layer.

20 Claims, 16 Drawing Sheets

(56) References Cited

FOREIGN PATENT DOCUMENTS

| | | |
|---|---|---|
| JP | 2006-514393 A | 4/2006 |
| JP | 2006-514440 A | 4/2006 |
| JP | 2006-196516 A | 7/2006 |
| JP | 2006-203098 A | 8/2006 |
| JP | 2006-319028 A | 11/2006 |
| JP | 2007-165873 A | 6/2007 |
| TW | 200735281 | 9/2007 |
| WO | WO-2006121837 A2 | 11/2006 |
| WO | WO-2007/102483 A1 | 9/2007 |
| WO | WO-2008/149605 A1 | 12/2008 |

OTHER PUBLICATIONS

Korean Office Action dated Nov. 25, 2013, issued in Korean Application No. 10-2008-0007082.

* cited by examiner

RESISTIVE MEMORY DEVICES AND METHODS OF MANUFACTURING THE SAME

PRIORITY STATEMENT

This non-provisional patent application claims priority under 35 U.S.C. §119 to Korean Patent Application No. 10-2008-0007082, filed on Jan. 23, 2008, in the Korean Intellectual Property Office, the entire contents of which is incorporated herein by reference.

BACKGROUND

Description of the Related Art

A resistive random access memory (RRAM) is a non-volatile memory device that uses changing resistance characteristics of a material having a variable resistance that changes significantly at a particular voltage. In one example, the material may be a transition metal oxide. When a set voltage is applied to a variable resistance material, a resistance of the variable resistance material decreases. This state is referred to as an ON state. When a reset voltage is applied to a variable resistance material, the resistance of the variable resistance material increases. This state is referred to as an OFF state. Among conventional RRAMs, a multi-layer cross point RRAM has a relatively simple cell structure and relatively high density.

A storage node of the conventional RRAM includes a variable resistance layer composed of the variable resistance material. The conventional RRAM uses a metal oxide layer such as a nickel oxide $NiO_X$ as the resistive switching layer.

However, characteristics of the conventional variable resistance layer may deteriorate relatively easily as a result of etching damage.

SUMMARY

Example embodiments relate to semiconductor devices and methods of manufacturing semiconductor devices, for example, resistive memory devices and methods of manufacturing the same.

At least one example embodiment provides a resistive memory device using changing resistance characteristics of a variable resistance material and a method of manufacturing the resistive memory device.

According to at least one example embodiment, a resistive memory device may include a first electrode, and a first insulation layer disposed on the first electrode. A portion of the first electrode may be exposed through a first hole in the first insulation layer. A first variable resistance layer may contact the exposed portion of the first electrode and extend on the first insulation layer around the first hole. A first switching device may be electrically connected to the first variable resistance layer.

According to at least some example embodiments, the first switching device may be a first diode. The first switching device may be disposed on the first variable resistance layer. A first intermediate electrode may be interposed between the first variable resistance layer and the first switching device, and a second electrode may be disposed on the first switching device. The first switching device may be formed outside the first hole. At least a portion of the first switching device may be formed inside the first hole. The first and second electrodes may be arranged as a pattern of wires that cross one another. The resistive memory device may further include an interlayer insulation layer disposed on the first insulation layer around the first variable resistance layer, the first intermediate electrode, and the first switching device.

According to at least some example embodiments, the resistive memory device may further include a second switching device and a second intermediate electrode sequentially stacked on the second electrode. A portion of the second intermediate electrode may be exposed through a second hole in the second insulation layer. A second variable resistance layer may contact the exposed portion of the second intermediate electrode and extend on the second insulation layer around the second hole. A third electrode may contact the second variable resistance layer. The second insulation layer may cover side surfaces of the second intermediate electrode, the second switching device, and the second electrode. The second and third electrodes may be arranged as a pattern of wires that cross one another. The resistive memory device may be a multi-layer cross point resistive memory having a 1 diode-1 resistance (1D-1R) cell structure.

At least one other example embodiment provides a method of manufacturing a resistive memory device. The resistive memory device may include a variable resistance layer and a switching device electrically connected to the variable resistance layer. According to at least this example embodiment, a first insulation layer may be formed on a first electrode. An etching process may be performed on the first insulation layer to form a first hole exposing a portion of the first electrode. A first variable resistance layer covering the exposed portion of the first electrode and the first insulation layer may be formed around the exposed portion of the first electrode.

According to at least some example embodiments, a first intermediate electrode and a first switching device may be formed sequentially on the first variable resistance layer. The first switching device may be formed outside the first hole. Alternatively, at least a portion of the first switching device may be formed within the first hole. The first variable resistance layer, the first intermediate electrode, and the first switching device may be formed by using the same or substantially the same etching mask.

According to at least some example embodiments, an interlayer insulation layer may be formed on the first insulation layer around the first variable resistance layer, the first intermediate electrode, and the first switching device. A second electrode may be formed on the first switching device. The first and second electrodes may be arranged as a pattern of wires that cross one another. The method may further include sequentially forming a second switching device and a second intermediate electrode on the second electrode.

According to at least some example embodiments, a second insulation layer may be formed on the second intermediate electrode. A portion of the second intermediate electrode may be exposed through a second hole in the second insulation layer. A second variable resistance layer may be formed to cover the exposed portion of the second intermediate electrode and the second insulation layer. The second variable resistance layer may also be formed around the exposed portion. A third electrode may be formed to contact the second variable resistance layer. The second and third electrodes may be arranged as a pattern of wires that cross one another.

At least one other example embodiment provides a resistive memory device. According to at least this example embodiment, a plurality of first electrodes may be arranged in parallel. A first insulation layer may be arranged on the plurality of first electrodes. A plurality of separate portions of the first electrodes may be exposed through a plurality of first holes in the first insulation layer. The resistive memory device may further include a stack structure corresponding to each of the plurality of first holes. Each stack structure may include a first variable resistance layer portion and a first switching device. The first variable resistance layer portion may contact a corresponding exposed portion of the plurality of first electrodes and may extend onto the first insulation layer. The first switching device may be electrically connected to the first variable resistance layer portion.

According to at least some example embodiments, the first switching device may be arranged on the first variable resistance layer. The stack structure may further include a first intermediate electrode interposed between the first variable resistance layer and the first switching device, and a second electrode disposed on the first switching device. An interlayer insulation layer may be arranged on the first insulation layer around the first variable resistance layer, the first intermediate electrode, and the first switching device of each stack structure.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
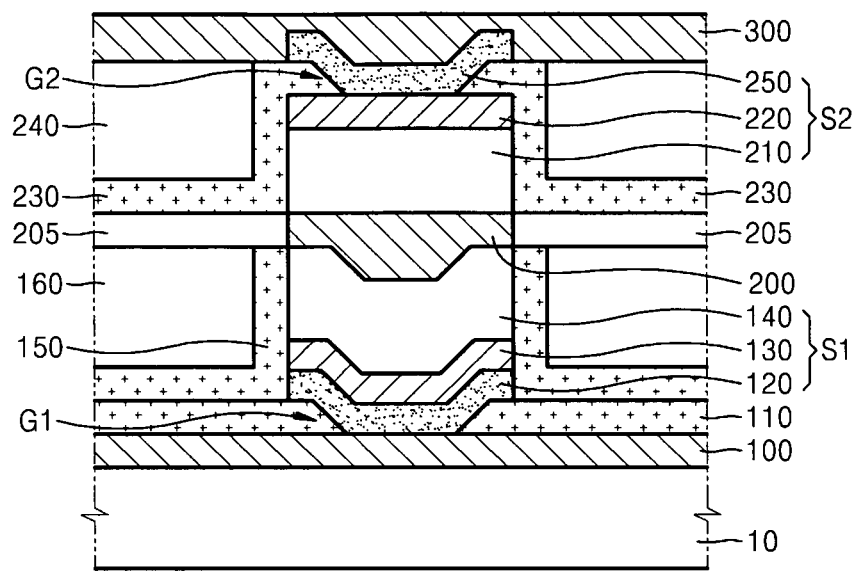
FIG. 1 is a cross-sectional view illustrating a resistive memory according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. In the drawings, the thicknesses of layers and regions are exaggerated for clarity. Like reference numerals in the drawings denote like elements.

FIG. 1 illustrates a resistive memory according to an example embodiment.

Referring to FIG. 1, a first electrode 100 may be disposed on a substrate 10. The substrate 10 may be one of a silicon substrate, a glass substrate, a hard plastic substrate, a flexible plastic substrate, and the like. The first electrode 100 may be formed by patterning a metal layer in a given, desired or predetermined shape, for example, in line shape. A first intermediate insulation layer (not shown) may be disposed on the substrate 10 around the first electrode 100. The first intermediate insulation layer may have a height similar or substantially similar to that of the first electrode 100. A first lower insulation layer 110 having a first hole G1 may be disposed on the first electrode 100. The first hole G1 may expose a portion of an upper surface of the first electrode 100. The first lower insulation layer 110 may cover an upper surface of the first intermediate insulation layer.

The first hole G1 may be formed by performing a sloped etching process so that a diameter of the first hole G1 decreases in a direction toward the first electrode 100. Otherwise, the diameter of the first hole G1 may be constant or substantially constant instead of varying according to height. The first lower insulation layer 110 may be a layer composed of an insulation material such as aluminum oxide $Al_2O_3$, titanium dioxide $TiO_2$, silicon dioxide $SiO_2$, silicon nitride $Si_3N_4$, or the like. In one example, the first lower insulation layer 110 may be an $Al_2O_3$ layer. In a case in which the first lower insulation layer 110 is an $Al_2O_3$ layer or other material having similar or substantially similar characteristics, a silicide reaction between the first lower insulation layer 110 and the first variable resistance layer 120 may be suppressed and/or prevented. Hydrogen permeation into the first variable resistance layer 120 formed may also be suppressed.

The first variable resistance layer 120 contacting the portion of the first electrode 100 exposed by the first hole G1 may extend onto the first lower insulation layer 110 around the first hole G1. Therefore, side surfaces of the first variable resistance layer 120, for example, etched edges thereof may not contact the first electrode 100. According to at least one example embodiment, an effective region of the first variable resistance layer 120 showing resistance changing characteristics is the portion contacting the first electrode 100. The portions of the first variable resistance layer 120 existing on an upper surface of the first lower insulation layer 110 may not contact the first electrode 100, and thus, these portions of the first variable resistance layer 120 may not effectively operate. Therefore, even if the side surfaces of the first variable resistance layer 120 are damaged by an etching process, deterioration of the resistance changing characteristics of the first variable resistance layer 120 may be suppressed. A metal oxide having non-stoichiometric compounds (e.g., a nickel oxide (Ni—O), a titanium oxide (Ti—O), a hafnium oxide (Hf—O), a zirconium oxide (Zr—O), a zinc oxide (Zn—O), a tungsten oxide (W—O), a cobalt oxide (Co—O), a niobium oxide (Nb—O), a titanium-nickel oxide (Ti—Ni—O), a lithium-nickel oxide (Li—Ni—O), an aluminum oxide (Al—O), an indium-zinc oxide (In—Zn—O), a vanadium oxide (V—O), a strontium-zirconium oxide (Sr—Zr—O), a strontium-titanium oxide (Sr—Ti—O), a chromium oxide (Cr—O), an iron oxide (Fe—O), a copper oxide (Cu—O), a tantalum oxide (Ta—O), or the like) may be used as a material of the first variable resistance layer 120.

A first intermediate electrode 130 and a first switching device 140 may be sequentially disposed on the first variable resistance layer 120. In this example, the first intermediate electrode 130 may electrically connect the first variable resistance layer 120 with the first switching device 140. Accordingly, without the first intermediate electrode 130, the first switching device 140 may operate as a resistor, which may result in a problem with operation of the device. The first switching device 140 may be a diode (e.g., a vertical diode) and may have a structure in which a P-type oxide layer and an N-type oxide layer are sequentially stacked or a structure in which a P-type silicon layer and an N-type silicon layer are stacked sequentially. For example, the first switching device 140 may be a structure in which a P-type oxide layer (e.g., a CuO layer or the like) and an N-type oxide layer (e.g., an InZnO layer or the like) may be stacked sequentially.

The first variable resistance layer 120, the first intermediate electrode 130, and the first switching device 140 may be formed by a single etching process using the same or substantially the same etching mask. Accordingly, the first variable resistance layer 120, the first intermediate electrode 130, and the first switching device 140 may have the same or substantially the same plan shape. A first contact electrode layer (not shown) may be disposed on the first diode 140. In this example, the first contact electrode layer may be patterned along with the first variable resistance layer 120, the first intermediate electrode 130, and the first switching device 140.

A stacked structure including the first variable resistance layer 120, the first intermediate electrode 130, and the first switching device 140 may be referred to as a first stacked structure S1. A plan structure of the first stacked structure S1 will be described in more detail later.

A first interlayer insulation layer 160 may be disposed on the first lower insulation layer 110 around the first stacked structure S1. A first protective insulation layer 150 may be disposed between the first interlayer insulation layer 160 and the first stacked structure S1. A first protective insulation layer 150 may also be formed between the first interlayer insulation layer 160 and the first lower insulation layer 110. The first protective insulation layer 150 may be composed of a material different from the first interlayer insulation layer 160.

Alternatively, the first protective insulation layer 150 may be disposed between the first interlayer insulation layer 160 and the first stacked structure S1, but not between the first interlayer insulation layer 160 and the first lower insulation layer 110. The first protective insulation layer 150 may be made of the same or substantially the same material as the first lower insulation layer 110 so as to protect the first variable resistance layer 120 and the first switching device 140 from hydrogen permeation. For example, in an example in which the first protective insulation layer 150 is an $Al_2O_3$ layer or a similar material, a silicide reaction between the first protective insulation layer 150 and the first variable resistance layer 120 and between the first protective insulation layer 150 and the first switching device 140 may be suppressed and/or prevented when forming the first protective insulation layer 150. The first interlayer insulation layer 160 may be formed to have a height greater than or equal to that of the first stacked structure S1. The first protective insulation layer 150 formed between the first interlayer insulation layer 160 and the first stacked structure S1 may be formed to have a height greater than or equal to the first stacked structure S1.

A second electrode 200 may be disposed on the first switching device 140. The second electrode 200 may be formed by patterning a metal layer in a line shape such that the second electrode 200 and the first electrode 100 cross one another (e.g., perpendicularly). In this example, the first stacked structure S1 may be disposed at a cross point between the first and second electrodes 100 and 200.

A second intermediate insulation layer 205 may be disposed on the first interlayer insulation layer 160 and the first protective insulation layer 150 around the second electrode 200. The second intermediate insulation layer 205 may have the same or substantially the same height as the second electrode 200. A second switching device 210 and a second intermediate electrode 220 may be disposed sequentially on the second electrode 200. A rectifying direction of the second switching device 210 may be opposite to, or the same as, a rectifying direction of the first switching device 140. The second switching device 210 and the second intermediate electrode 220 may be formed by performing a patterning process by using the same or substantially the same etching mask. A second contact electrode layer (not shown) having the same or substantially the same plan shape as the second switching device 210 may be disposed between the second switching device 210 and the second electrode 200.

A second lower insulation layer 230 having a second hole G2 for exposing a portion of an upper surface of the second intermediate electrode 220 may be disposed on the second intermediate electrode 220. The second lower insulation layer 230 may be formed to cover side surfaces of the second intermediate electrode 220 and the second switching device 210. The second lower insulation layer 230 may also cover the upper surface of the second intermediate insulation layer 205. The second lower insulation layer 239 may be composed of the same or substantially the same material as the first lower insulation layer 110. A second interlayer insulation layer 240 may be disposed to surround the second lower insulation layer 230. The second interlayer insulation layer 240 may have a height similar or substantially similar to that of the second lower insulation layer 230.

A second variable resistance layer 250 contacting the second intermediate electrode 220 exposed by the second hole G2 may be provided. The second variable resistance layer 250 may be composed of the same or substantially the same material as the first variable resistance layer 120 and may have a shape similar or substantially similar to the first variable resistance layer 120. For example, the second variable resistance layer 250 may extend onto the second lower insulation layer 230 around the second hole G2.

A third electrode 300 may be disposed on the second interlayer insulation layer 240 to contact the second variable resistance layer 250. The third electrode 300 may have a line shape extending to the second lower insulation layer 230 and the second interlayer insulation layer 240 at both sides of the second variable resistance layer 250 so that the third electrode 300 and the second electrode 200 cross one another (e.g., perpendicularly). In this example, the second switching 210, the second intermediate electrode 200, and the second variable resistance layer 250 may be disposed at a cross point between the second electrode 200 and the third electrode 300. A stacked structure including the second switching device 210, the second intermediate electrode 220, and the second variable resistance layer 250 is referred to as a second stacked structure S2. The second variable resistance layer 250 may be formed in a line shape. For example, the second variable resistance layer 250 may extend between the third electrode 300 and the second interlayer insulation layer 240. In this example, the second variable resistance layer 250 and the third electrode 300 may be patterned by a single process, thereby decreasing the number of processes. A contact region between the second variable resistance layer 250 and the second intermediate electrode 220 may be determined by a size of the second hole G2, and only a region of the second variable resistance layer 250 contacting the second intermediate electrode 220 may be an effective resistance changing region. Therefore, even if a patterned shape of the second variable resistance layer 250 is changed, the device operation may not be changed. The second switching device 210 may be diode.

Although not shown in FIG. 1, a stacked structure (not shown) similar or substantially similar to the first stacked structure S1 and a fourth electrode (not shown) similar or substantially similar to the second electrode 200 may be sequentially disposed on the third electrode 300. A stacked structure (not shown) similar or substantially similar to the second stacked structure S2 and a fifth electrode (not shown) similar or substantially similar to the third electrode 300 may further be sequentially disposed on the fourth electrode. A stacked structure (not shown) including a variable resistance layer and a diode, and an electrode (not shown) may further be alternately stacked on the fifth electrode.

A structure above the second electrode 200 is not included in the structure illustrated in FIG. 1. In this example, a cross point resistive memory including the first electrode 100, the second electrode 200, and the first stacked structure S1 disposed between the first and second electrodes 100 and 200 may be provided. Alternatively, in the structure illustrated in FIG. 1, a structure below the second electrode 200 may be omitted. In this example, a cross point resistive memory including the second electrode 200, the third electrode 300, and the second stacked structure S2 disposed between the second and third electrodes 200 and 300 may be provided.

Figure 2A:
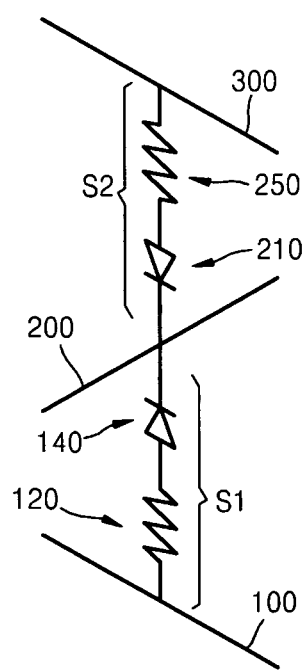
FIGS. 2A, 2B, and 3 are circuit diagrams illustrating resistive memories according to example embodiments.
Figure 2B:
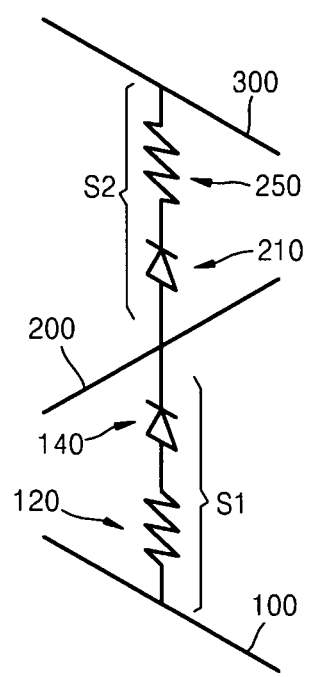

The first electrode 100, the first stacked structure S1, the second electrode 200, the second stacked structure S2, and the third electrode 300 illustrated in FIG. 1 may have a circuit configuration illustrated in FIG. 2A or 2B. Rectifying directions of the first and second diodes 140 and 210 illustrated in FIGS. 2A and 2B may be changed. In addition, positions of the first variable resistance layer 120 and the first switching device 140 in the first stacked structure S1 may be exchanged with each other. This may be applied to the second stacked structure S2.

In FIG. 1, a plurality of the first electrodes 100, the second electrodes 200, and the third electrodes 300 may be provided. In this example, the first stacked structure S1 may be disposed at each cross point between the first and second electrodes 100 and 200, and the second stacked structure S2 may be disposed at each cross point between the second and third electrodes 200 and 300. A multi-layer cross point resistive memory including the structure illustrated in FIG. 1 may have a circuit configuration illustrated in FIG. 3.

Figure 3:
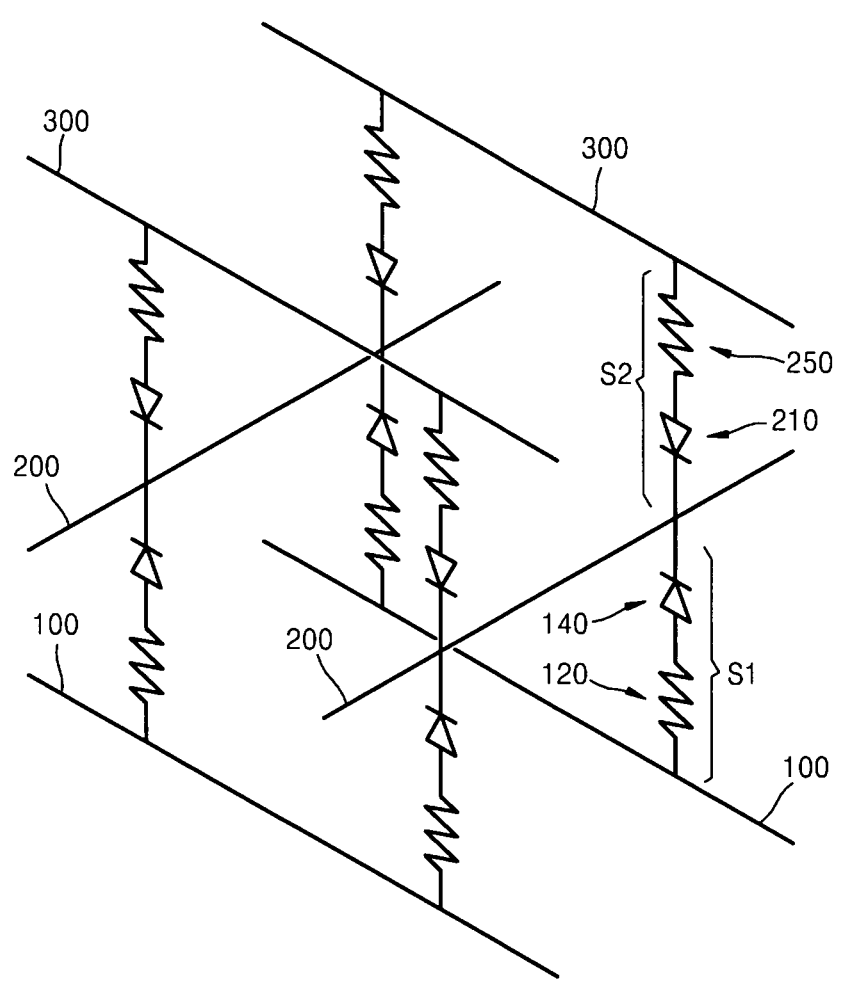

Referring to FIG. 3, a plurality of the second electrodes 200 may be disposed on a plurality of the first electrodes 100 to cross each other, and the first stacked structure S1 may be disposed at each of cross points there between. In addition, a plurality of the third electrodes 300 may be disposed on a plurality of the second electrodes 200 to cross each other, and the second stacked structure S2 may be disposed at each of cross points there between. In FIG. 3, rectifying directions of the first and second switching devices 140 and 210 may be changed, positions of the first variable resistance layer 120 and the first switching device 140 may be exchanged, and positions of the second variable resistance layer 250 and the second switching device 210 may be exchanged.

Figure 4:
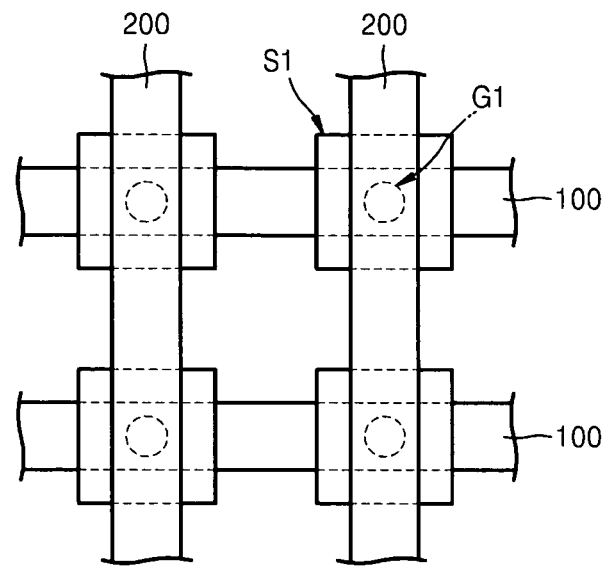
FIGS. 4 and 5 are top plan views illustrating resistive memories according to example embodiments.
Figure 5:
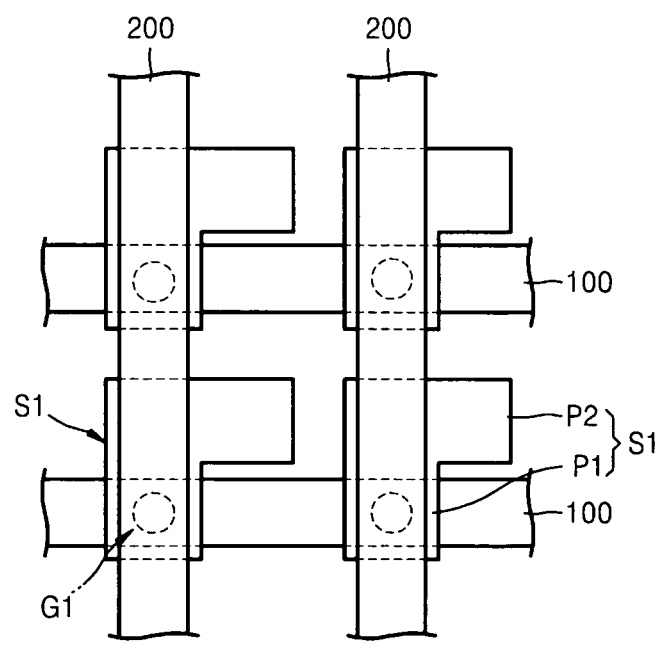

FIGS. 4 and 5 illustrate plan structures of the first electrode 100, the first stacked structure S1, and the second electrode 200 illustrated in FIG. 3.

Referring to FIG. 4, the stacked structure S1 having a shape of a rectangular pole may be disposed between the first and second electrodes 100 and 200. A width of the first stacked structure S1 may be greater than that of the first electrode 100. A diameter of the first hole G1 (which may have a cylindrical shape) may be less than the width of the first electrode 100. Shapes and sizes of the first stacked structure S1 and the first hole G1 may be modified in various forms. For example, the first stacked structure S1 may have a cylindrical or another shape and the width of the first stacked structure S1 may be changed according to a height thereof. Although not shown in the figure, plan structures of the second stacked structure S2 and the second hole G2 may be the same or substantially the same as the plan structures of the first stacked structure S1 and the first hole G1 illustrated in FIG. 4. The third electrode 300 may have the same or substantially the same plan structure as the first electrode 100. However, the second variable resistance layer 250 and the second diode 210 in the second stacked structure S2 may have different plan structures from each other.

Referring to FIG. 5, the first stacked structure S1 may include a first portion p1 disposed at a cross point between the first and second electrodes 100 and 200 and a second portion p2 connected to the first portion p1 and extending to the outside of the cross point. The first stacked structure S1 may have an asymmetric shape extending to the outside of the cross point between the first and second electrodes 100 and 200. For example, the first stacked structure S1 may have an 'L' shape.

As a width of the first stacked structure S1 increases, a width of the first diode 140 may increase. Accordingly, a forward current of the first diode 140 increases, and switching characteristics may improve. Although not shown in the figure, the plan structures of the second stacked structure S2 and the second hole G2 may be the same or substantially the same as the plan structures of the first stacked structure S1 and the first hole G1 illustrated in FIG. 5, respectively, and the third electrode 300 may have the same or substantially the same plan structure as the first electrode 100. However, the second variable resistance layer 250 and the second switching device 210 in the second stacked structure S2 may have different plan structures from each other.

In consideration of a manufacturing process, as illustrated in FIGS. 4 and 5, a plan width of the first stacked structure S1 may be greater than a plan diameter of the first hole G1. However, the first stacked structure S1 and the first hole G1 may be formed to have the same or substantially the same planar size, shape, and/or position. For example, the first stacked structure S1 illustrated in FIG. 1 may be formed to have a width that is the same or substantially the same as an upper diameter of the first hole G1. Similarly, planar shapes and sizes of the second diode 210 and the second intermediate electrode 220 may be modified in various forms.

Figure 6:
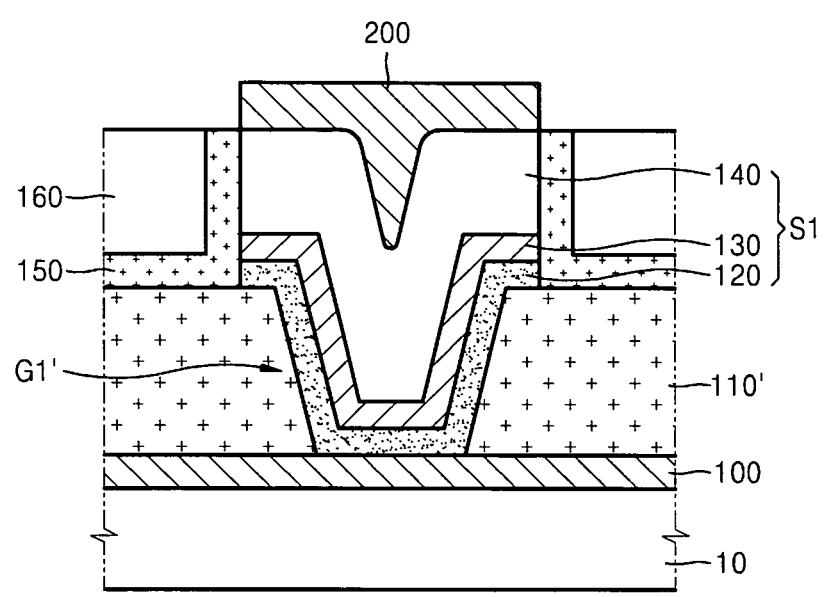
FIG. 6 is a cross-sectional view illustrating a resistive memory according to another example embodiment.

In at least one other example embodiment, a structure from the first lower insulation layer 110 to the second electrode 200 illustrated in FIG. 1 may be changed to be the structure illustrated in FIG. 6.

Comparing FIG. 6 to FIG. 1, a first lower insulation layer 110' illustrated in FIG. 6 may be thicker than the first lower insulation layer 110 illustrated in FIG. 1, and a first hole G1' illustrated in FIG. 6 may be formed to be deeper and larger than the first hole G1 illustrated in FIG. 1. Therefore, in the structure illustrated in FIG. 1, the first diode 140 may be disposed outside the first hole G1. However, in the structure illustrated in FIG. 6, at least a portion of the first switching device 140 may be disposed inside the first hole G1'. In the structure illustrated in FIG. 6, the first switching device 140 and the first intermediate electrode 130 may be bent (e.g., relatively sharply bent), so that a contact area there between is larger than that illustrated in FIG. 1.

FIGS. 7A to 7K illustrate a method of manufacturing a resistive memory according to an example embodiment.

Figure 7A:
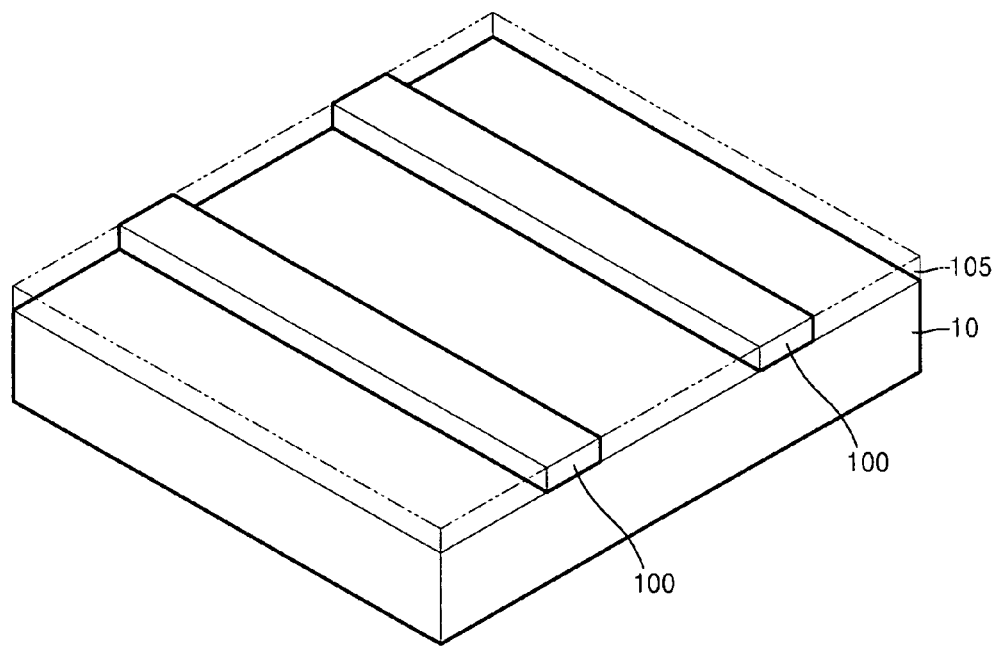
FIGS. 7A to 7K are perspective views for explaining a method of manufacturing a resistive memory according to an example embodiment.

Referring to FIG. 7A, a plurality of first electrodes 100 may be disposed on a substrate 10. The plurality of the first electrodes 100 may be wires arranged in parallel at equal or substantially equal intervals. The first electrode 100 may be formed by patterning a metal layer in an array of lines. At both sides of the first electrode 100 on the substrate 10, a first intermediate insulation layer 105 may be formed to have a similar, substantially similar, the same or substantially the same height as the first electrode 100. Alternatively, the first intermediate insulation layer 105 may be omitted.

Figure 7B:
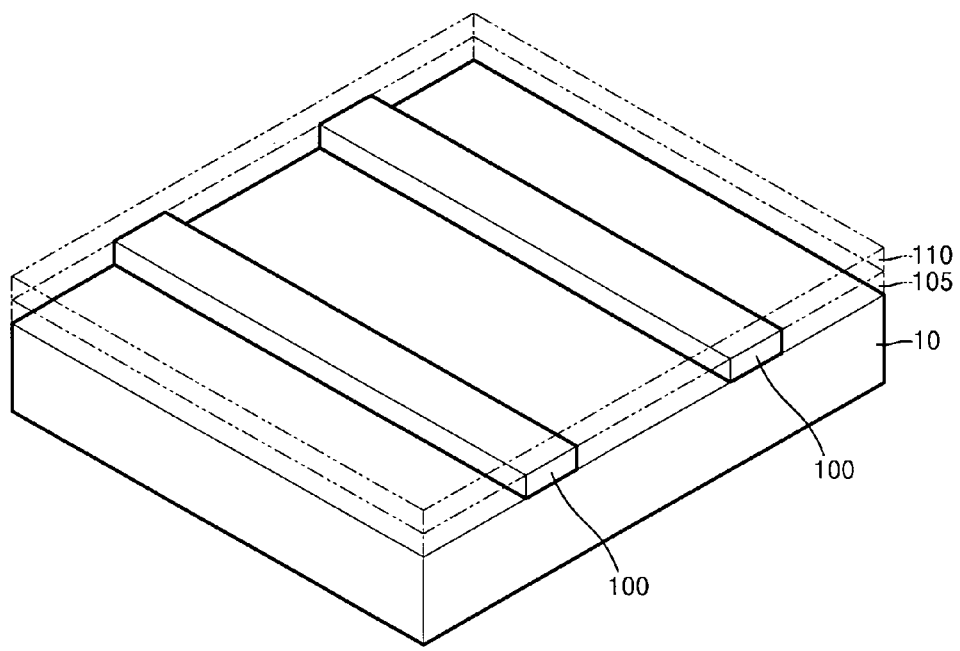

Referring to FIG. 7B, a first lower insulation layer 110 may be formed on the first electrode 100 and the first intermediate insulation layer 105. The first lower insulation layer 110 may be composed of an insulation material such as $Al_2O_3$, $TiO_2$, $SiO_2$, $Si_3N_4$, or the like. In one example, the first lower insulation layer 110 may be formed of $Al_2O_3$. When the first intermediate insulation layer 105 is omitted, the first lower insulation layer 110 may be formed to cover the first electrode 100. In this example, a chemical mechanical polishing (CMP) process may be performed to planarize an upper surface of the first lower insulation layer 110.

Figure 7C:
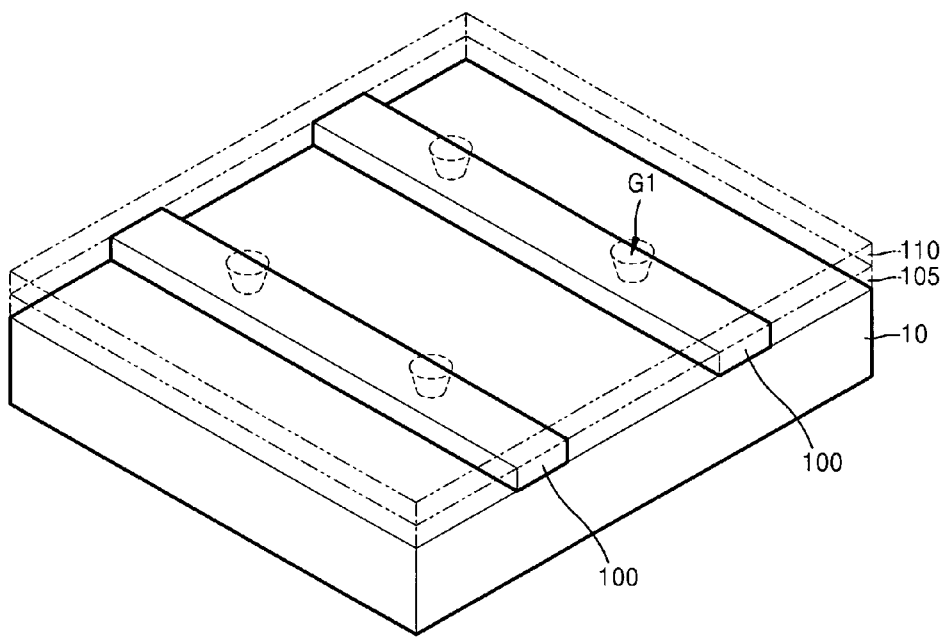

Referring to FIG. 7C, a first hole G1 may be formed by performing an etching process on the first lower insulation layer 110. The first hole G1 may expose a portion of the first electrode 100. The first hole G1 may be formed to have a cylindrical shape, but with tapered sidewalls. A plurality of the first holes G1 may be formed in the first lower insulation layer 110 at various portions of each of the first electrodes 100. In one example, the plurality of first holes G1 may be formed at regular (equal or substantially equal) intervals. Each first hole G1 may be formed by performing a sloped etching process, and thus a diameter of the first hole G1 may decrease in a direction toward the first electrode 100. Otherwise, the diameter of the first hole G1 may be constant or substantially constant irrespective of height.

Figure 7D:
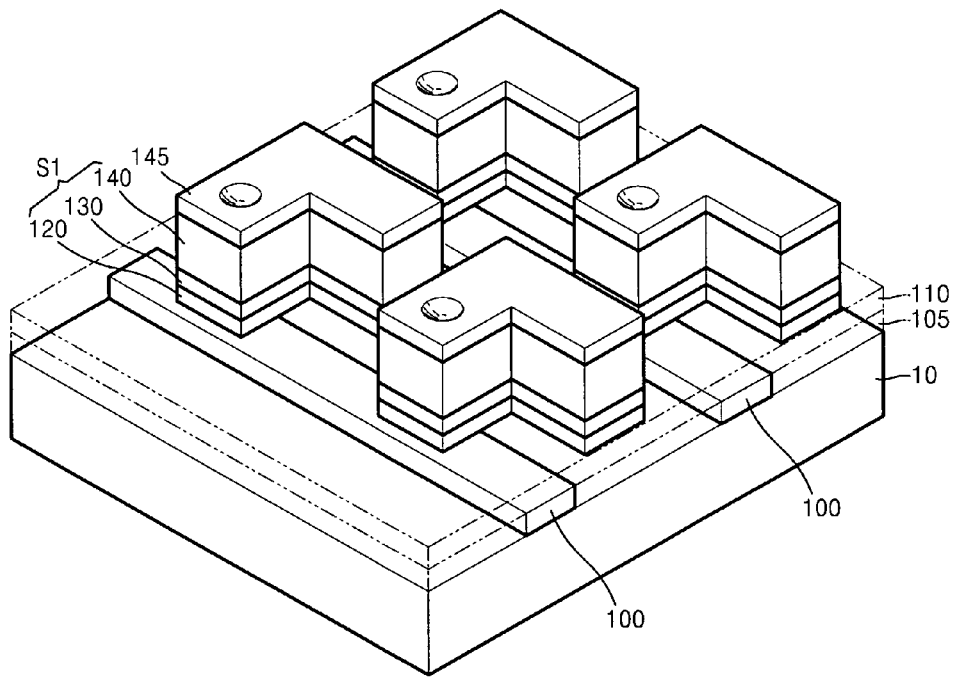

Referring to FIG. 7D, a stacked structure including a first variable resistance layer 120, a first intermediate electrode 130, a first switching device 140, and a first contact electrode layer 145 may be formed on the exposed portion of the first electrode 100 and the first lower insulation layer 110 around the exposed portion. The first variable resistance layer 120, the first intermediate electrode 130, and the first switching device 140 may form the first stacked structure S1 illustrated in FIG. 1. According to example embodiments, the first contact electrode layer 145 may be omitted. The first variable resistance layer 120, the first intermediate electrode 130, the first switching device 140, and the first contact electrode layer 145 may be layers formed by a patterning process using the same or substantially the same etching mask layer. Therefore, the layers may have the same or substantially the same plan shape. In this example, the first stacked structure S1 and the first contact electrode layer 145 may have the same or substantially the same plan structure as the first stacked structure S1 illustrated in FIG. 5, but may be modified in various forms. The first variable resistance layer 120 may be composed of a metal oxide having non-stoichiometric compounds, such as Ni—O, Ti—O, Hf—O, Zr—O, Zn—O, W—O, Co—O, Nb—O, Ti—Ni—O, Li—Ni—O, Al—O, In—Zn—O, V—O, Sr—Zr—O, Sr—Ti—O, Cr—O, Fe—O, Cu—O, Ta—O, a combination thereof or the like.

Figure 7E:
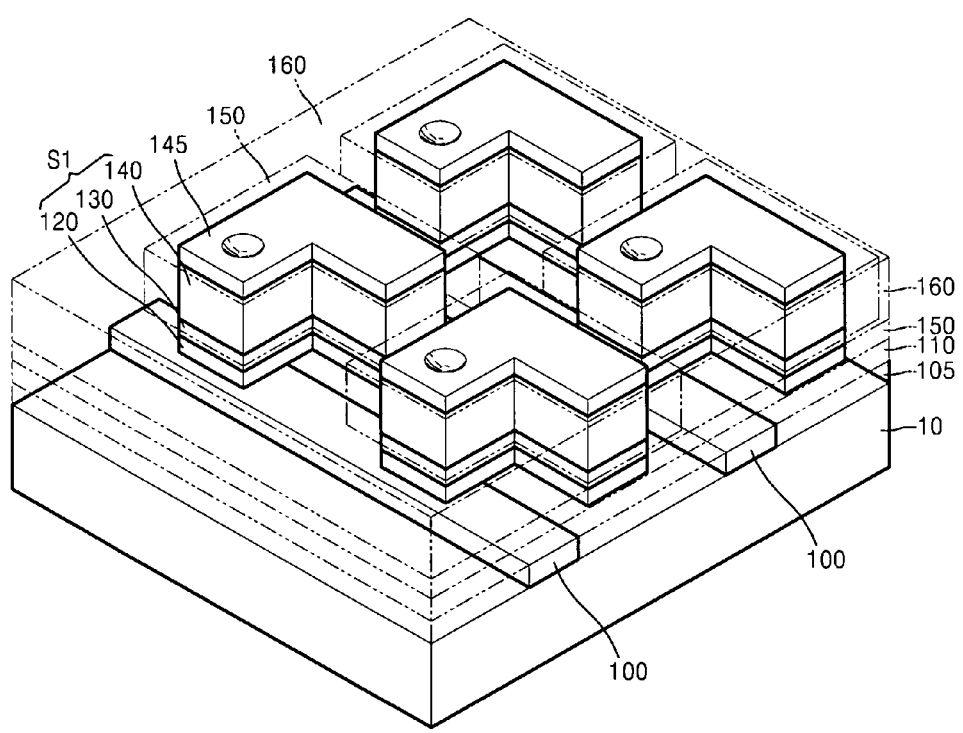

Referring to FIG. 7E, a protective insulation layer 150 for covering side surfaces of the first stacked structure S1 and the first contact electrode layer 145 may be formed on the first lower insulation layer 110. A first interlayer insulation layer 160 may be formed on the protective insulation layer 150. The protective insulation layer 150 may be made of the same or substantially the same material as the first lower insulation layer 110. Upper exposed surfaces of the first contact electrode layer 145, the protective insulation layer 150, and the first interlayer insulation layer 160 may have similar, substantially similar, the same or substantially the same heights. However, the protective insulation layer 150 and the first interlayer insulation layer 160 may be formed to be higher than the first contact electrode layer 145. In addition, the protective insulation layer 150 may be disposed at side surfaces of the first stacked structure S1 and the first contact electrode layer 145 and on the first lower insulation layer 110. In alternative example embodiments, the protective insulation layer 150 may be omitted.

Figure 7F:
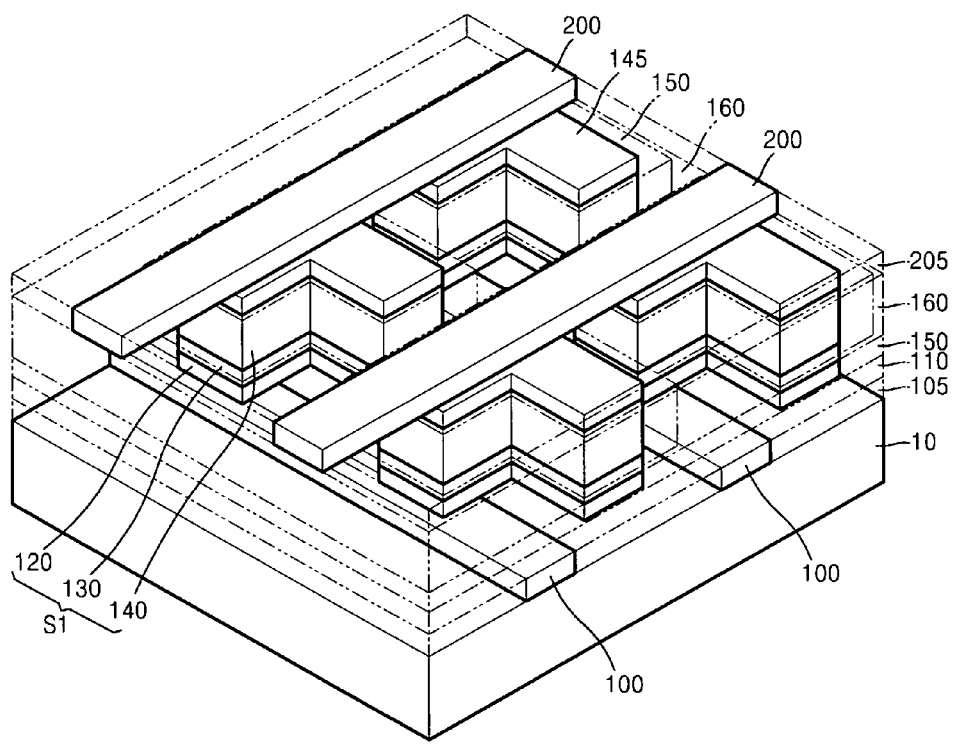

Referring to FIG. 7F, a plurality of second electrodes 200 may be formed to contact the first contact insulation layer 145. Each of the plurality of the second electrodes 200 may be disposed as a plurality of wires crossing (e.g., perpendicularly crossing) the first electrodes. Therefore, the first stacked structure S1 may be disposed at a cross point between the first and second electrodes 100 and 200. The second electrode 200 may have a plan structure similar or substantially similar to the first stacked structure S1 at the cross point between the second and first electrodes 200 and 100. At the cross point between the first and second electrodes 100 and 200, a portion of the second electrode 200 may extend to an upper portion of the first stacked structure S1. As described above, in an example embodiment in which the portion of the second electrode 200 has a structure (hereinafter, referred to as a modified structure) extending to the upper portion of the first stacked structure S1, the first contact insulation layer 145 may be omitted, and the second electrode 200 may directly contact the entire upper surface of the first stacked structure S1. In addition, in an example embodiment in which the second electrode 200 has the modified structure, a second contact electrode layer 207 (see FIG. 7G) may be omitted from the manufacturing process performed later.

After forming the second electrodes 200, a second intermediate insulation layer 205 may be formed to have a similar, substantially similar, the same or substantially the same height as the second electrode 200 on the first interlayer insulation layer 160, the protective insulation layer 150, and the first contact electrode layer 145, at both sides of the second electrode 200.

Figure 7G:
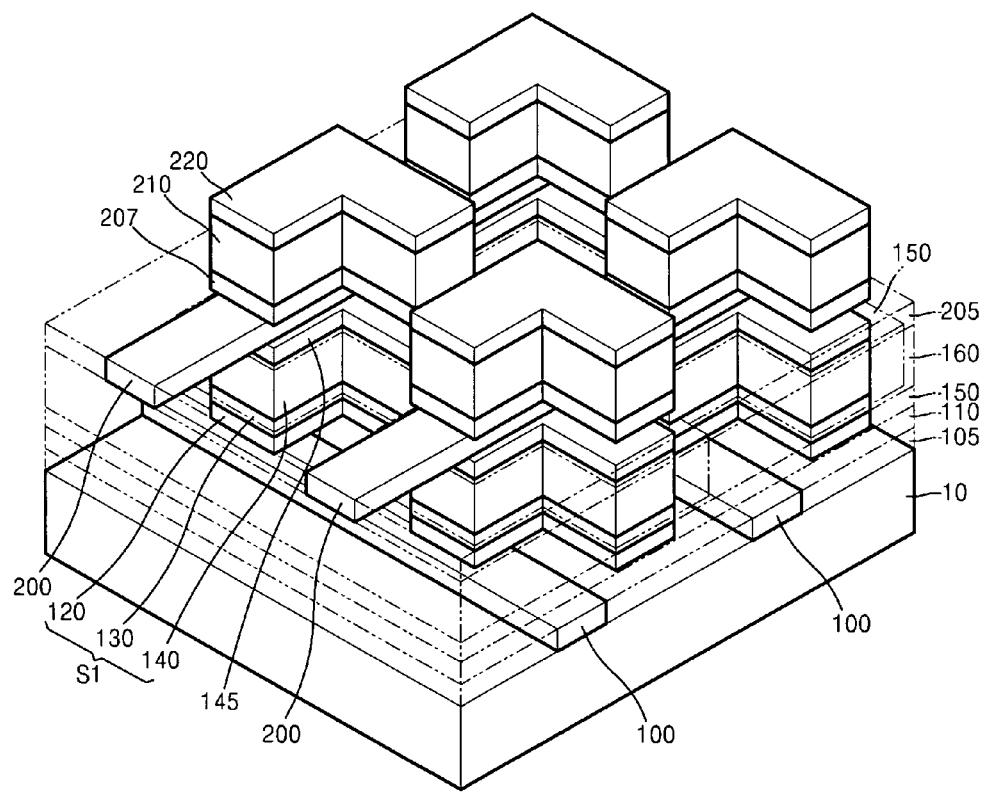

Referring to FIG. 7G, a stacked structure in which the second contact electrode layer 207, a second switching device 210, and a second intermediate electrode 220 are stacked sequentially on the second electrode 200 above the first stacked structure S1 may be formed. Alternatively, the second contact electrode layer 207 may be omitted. The second contact electrode layer 207, the second diode 210, and the second intermediate electrode 220 may be formed using patterning process using the same or substantially the same etching mask layer. The layers may have the same or substantially the same plan structure as the first stacked structure S1, but may also be different in alternative example embodiments.

Figure 7H:
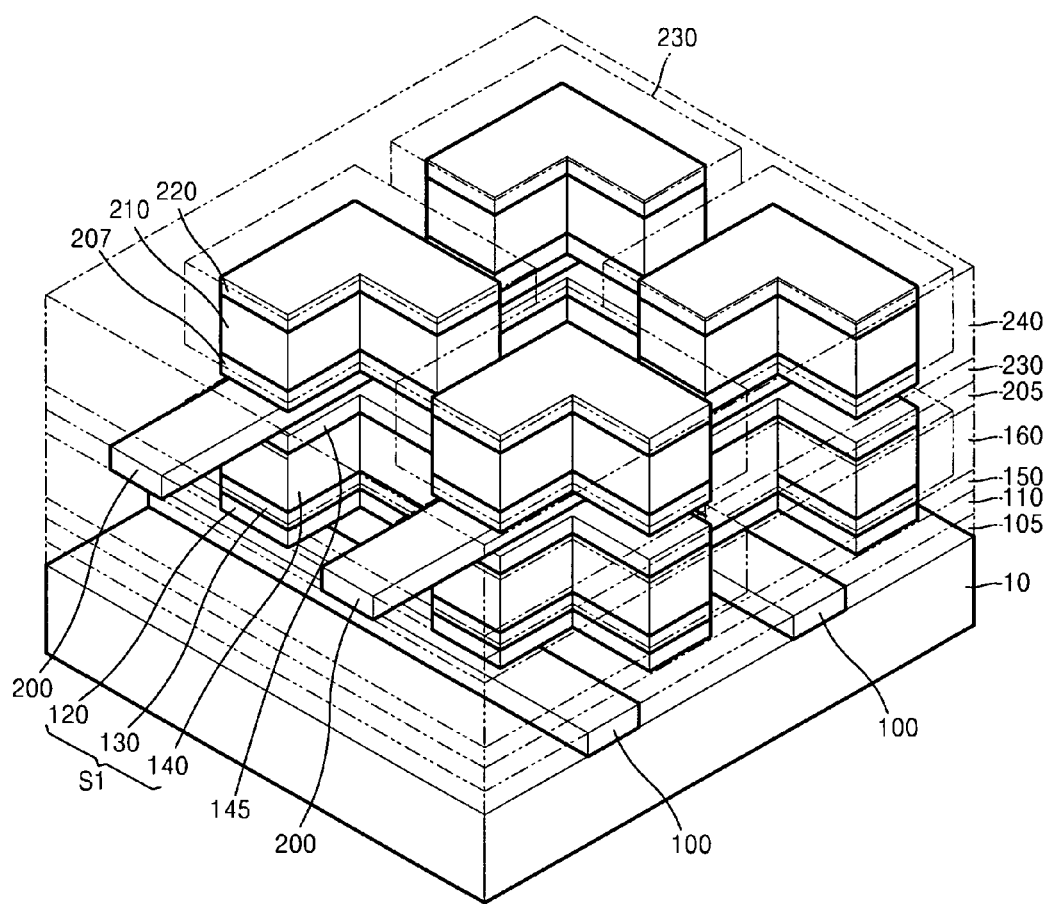

Referring to FIG. 7H, a second lower insulation layer 230 may be formed to cover the second contact electrode layer 207, the second switching device 210, and the second intermediate electrode 220 on the second intermediate insulation layer 205 and the second electrode 200. An insulation layer may be formed on the second lower insulation layer 230, and the CMP process may be performed on the insulation layer to expose the second lower insulation layer 230 on the second intermediate electrode 220. After performing the CMP process, the remaining insulation layer may become the second interlayer insulation layer 240.

Figure 7I:
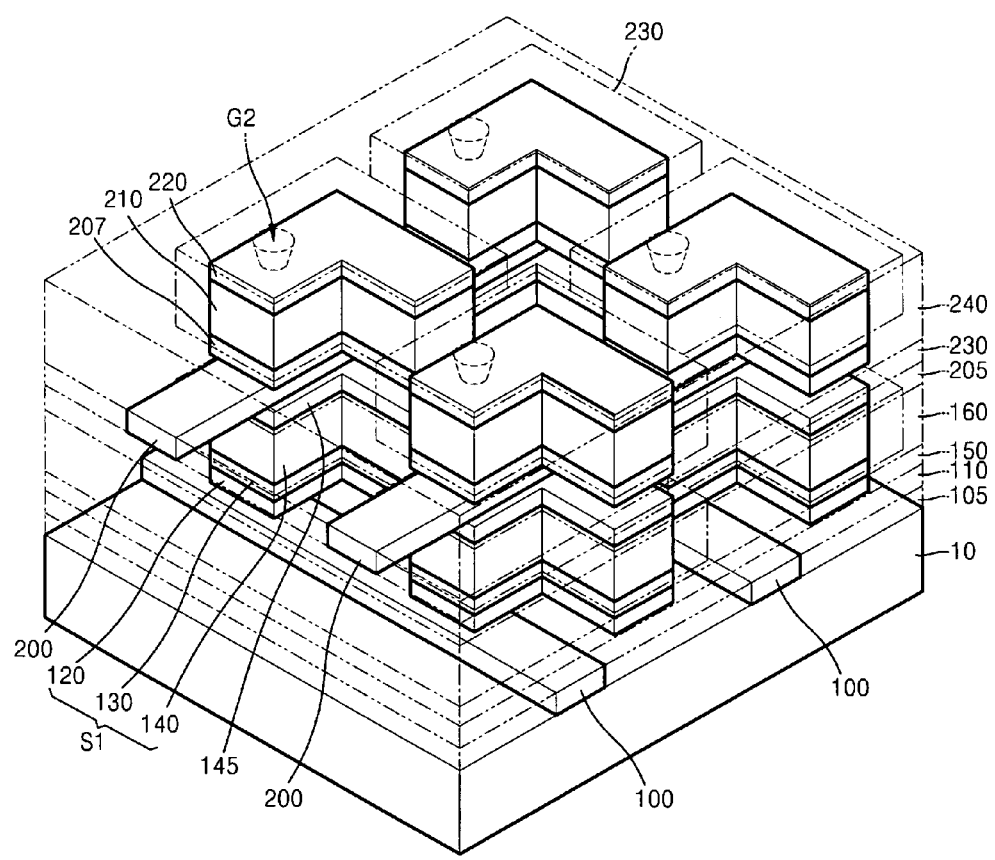

Referring to FIG. 7I, portions of the second lower insulation layer 230 may be removed to form a plurality of second holes G2. Each second hole G2 may expose a portion of the second intermediate electrode 220. The second holes G2 may have a similar or substantially similar shape to the first hole G1.

Figure 7J:
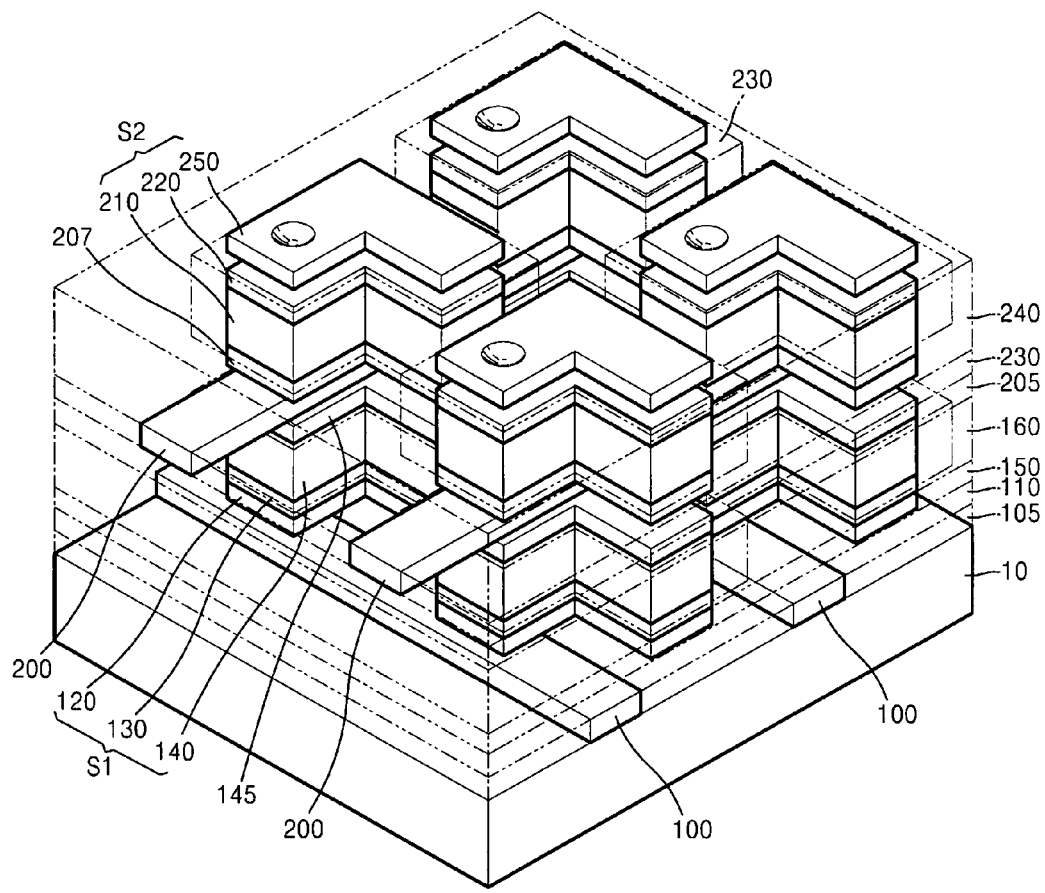

Referring to FIG. 7J, a second variable resistance layer 250 may be formed on the exposed portions of the second intermediate electrode 220 and the second lower insulation layer 230 around the exposed portions of the second intermediate electrode 220. The second variable resistance layer 250 may be made of the same or substantially the same material as the first variable resistance layer 120 and may have the same or substantially the same plan shape as the second intermediate electrode 220. However, the shape of the second variable resistance layer 250 may be modified. For example, the second variable resistance layer 250 may have a plan shape of a square, a rectangular, a circle, a line, or the like. The second switching device 210, the second intermediate electrode 220, and the second variable resistance layer 250 may form a second stacked structure S2, and the second stacked structure S2 may correspond to the second stacked structure S2 illustrated in FIG. 1.

Figure 7K:
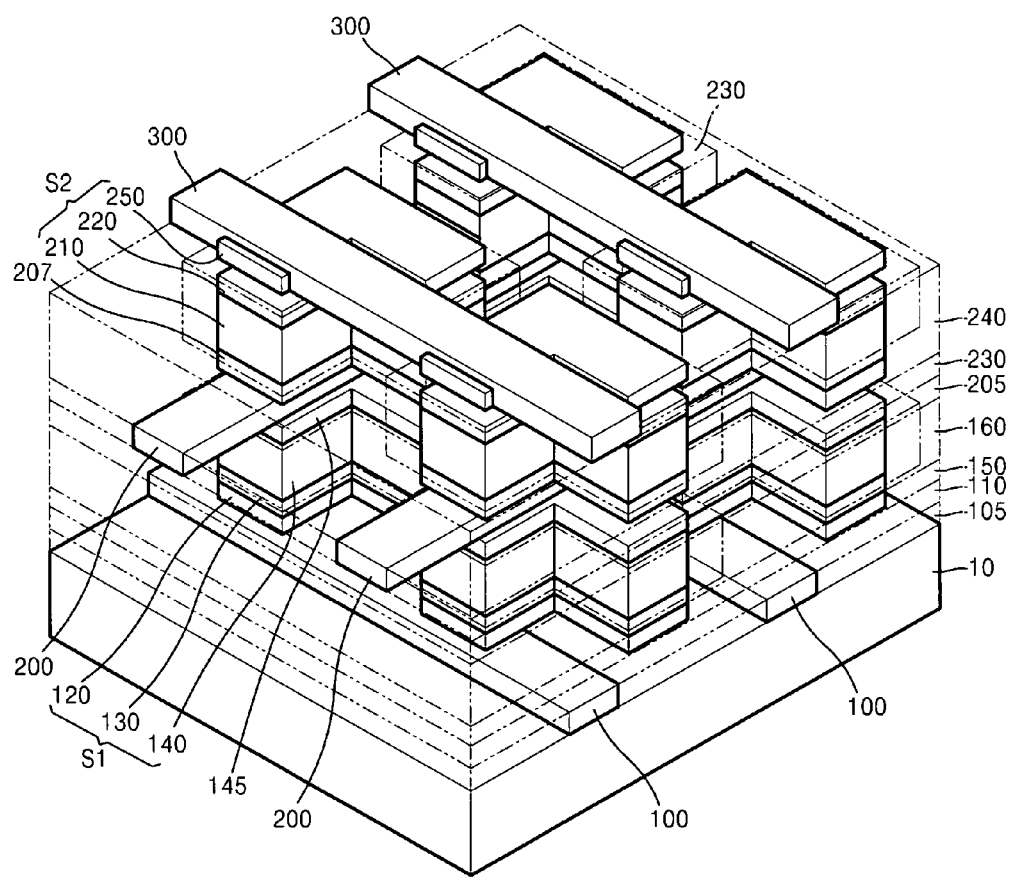

Referring to FIG. 7K, a plurality of third electrodes 300 may be formed to contact the second variable resistance layer 250. The third electrodes 300 may be formed in an array of lines extending to the second lower insulation layer 230 and the second interlayer insulation layer 240 at each side of the second variable resistance layer 250. The third electrodes may cross (e.g., perpendicularly cross) the second electrode 200. Thereafter, although not shown in the figure, a stacked structure including a variable resistance layer, a switching device and an electrode may be alternately formed on the third electrode 300. In this example, the variable resistance layer may be formed within a hole of a corresponding lower insulation layer.

While the present invention has been particularly shown and described with reference to example embodiments thereof, it will be understood by those skilled in the art that various changes in form and details may be made therein without departing from the spirit and scope of the present invention as defined by the appended claims. For example, the structure and components of the resistive memory according to example embodiments may be modified in various forms. For example, as the switching device in the structure illustrated in FIG. 1 or a modified structure, a transistor or a threshold device may be used instead of the diode. In addition, various types of diode instead of the general PN diode may be used. In addition or alternatively, the manufacturing method described with reference to FIGS. 7A to 7K may be modified in various forms.

What is claimed is:

1. A resistive memory device comprising:
a first electrode;
a first insulation layer arranged on the first electrode, a first portion of the first electrode being exposed through a first hole in the first insulation layer;
a first variable resistance layer contacting the exposed first portion of the first electrode and extending onto the first insulation layer;
a first switching device electrically connected to the first variable resistance layer;
a first intermediate electrode interposed between the first variable resistance layer and the first switching device; and
a second electrode on the first switching device; wherein
portions of the first insulation layer are between the first electrode and portions of the first variable resistance layer extending onto the first insulation layer,
the first variable resistance layer and the first switching device have a same cross-sectional width at a level higher than the first insulation layer,
a width of a contact region between the first variable resistance layer and the first electrode is smaller than a width of the first switching device, and
the first switching device is arranged on the first variable resistance layer.

2. The resistive memory device of claim 1, wherein the first switching device is formed outside the first hole.

3. The resistive memory device of claim 1, wherein at least a portion of the first switching device is formed within the first hole.

4. The resistive memory device of claim 1, wherein the first and second electrodes are arranged as a pattern of wires crossing each other.

5. The resistive memory device of claim 1, further comprising:
an interlayer insulation layer arranged on the first insulation layer around the first variable resistance layer, the first intermediate electrode, and the first switching device.

6. The resistive memory device of claim 1, further comprising:
a second switching device and a second intermediate electrode stacked sequentially on the second electrode;
a second insulation layer arranged on the second intermediate electrode, a portion of the second intermediate electrode being exposed through a second hole in the second insulation layer;
a second variable resistance layer contacting the exposed portion of the second intermediate electrode and extending on the second insulation layer around the second hole; and
a third electrode contacting the second variable resistance layer.

7. The resistive memory device of claim 6, wherein the second insulation layer covers side surfaces of the second intermediate electrode, the second switching device, and the second electrode.

8. The resistive memory device of claim 6, wherein the second and third electrodes are arranged as a pattern of wires crossing each other.

9. The resistive memory device of claim 8, wherein the resistive memory device is a multi-layer cross point resistive memory having a one diode-one resistor cell structure.

10. A resistive memory device comprising:
a plurality of first electrodes arranged in parallel;
a first insulation layer arranged on the plurality of first electrodes, a plurality of separate portions of at least one of the plurality of first electrodes being exposed through a plurality of first holes in the first insulation layer; and
a stack structure corresponding to each of the plurality of first holes, each stack structure including,
a first variable resistance layer contacting a corresponding exposed portion of one of the plurality of first electrodes and extending onto the first insulation layer, wherein portions of the first insulation layer are between the first electrode and portions of the first variable resistance layer extending onto the first insulation layer,
a first switching device electrically connected to the first variable resistance layer,
a first intermediate electrode between the first variable resistance layer and the first switching device, and
a second electrode on the first switching device, wherein
the first variable resistance layer and the first switching device have a same cross-sectional width at a level higher than the first insulation layer,
a width of a contact region between the first variable resistance layer and a corresponding first electrode is smaller than a width of the first switching device, and
the first switching device is arranged on the first variable resistance layer.

11. The resistive memory device of claim 10, further comprising:
a second switching device and a second intermediate electrode stacked sequentially on the second electrode;
a second insulation layer arranged on the second intermediate electrode, a portion of the second intermediate electrode being exposed through a second hole in the second insulation layer;
a second variable resistance layer contacting the exposed portion of the second intermediate electrode and extending onto the second insulation layer around the second hole; and
a third electrode contacting the second variable resistance layer.

12. A method of manufacturing the resistive memory device of claim 1, the method comprising:
forming the first electrode;
forming the first insulation layer on the first electrode;
etching the first insulation layer to expose the portion of the first electrode through the first hole; and
forming the first variable resistance layer covering the exposed portion of the first electrode, the first variable resistance layer extending on to the first insulation layer;
sequentially forming the first intermediate electrode and the first switching device on the first variable resistance layer; and
forming the second electrode on the first switching device.

13. The method of claim 12, wherein the first switching device is formed outside the first hole.

14. The method of claim 12, wherein at least a portion of the first switching device is formed within the first hole.

15. The method of claim 12, wherein the first variable resistance layer, the first intermediate electrode, and the first switching device are formed using the same etching mask.

16. The method of claim 12, further comprising:
forming an interlayer insulation layer on the first insulation layer around the first variable resistance layer, the first intermediate electrode, and the first switching device.

17. The method of claim 12, wherein the first and second electrodes arranged as a pattern of wires crossing each other.

18. The method of claim 12, further comprising:
sequentially forming a second switching device and a second intermediate electrode on the second electrode.

19. The method of claim 18, further comprising:
forming a second insulation layer on the second intermediate electrode, a portion of the second intermediate electrode being exposed through a second hole in the second insulation layer;
forming a second variable resistance layer covering the exposed portion of the second intermediate electrode and extending on to the second insulation layer; and
forming a third electrode contacting the second variable resistance layer.

20. The method of claim 19, wherein the second and third electrodes are arranged as a pattern of wires crossing each other.

* * * * *